(12) United States Patent
Yuzawa

(10) Patent No.: US 7,176,581 B2
(45) Date of Patent: Feb. 13, 2007

(54) SEMICONDUCTOR DEVICE HAVING CONDUCTIVE BUMPS, METHOD OF MANUFACTURING THEREOF, CIRCUIT BOARD AND ELECTRONIC APPARATUS

(75) Inventor: Takeshi Yuzawa, Nagano (JP)

(73) Assignee: Seiko Epson Corporation (JP)

( * ) Notice: Subject to any disclaimer, the term of this patent is extended or adjusted under 35 U.S.C. 154(b) by 51 days.

(21) Appl. No.: 11/113,908

(22) Filed: Apr. 25, 2005

(65) Prior Publication Data

US 2005/0253260 A1 Nov. 17, 2005

(30) Foreign Application Priority Data

Apr. 28, 2004 (JP) ............... 2004-133405

(51) Int. Cl.
*H01L 23/48* (2006.01)
*H01L 23/52* (2006.01)

(52) U.S. Cl. ...................... 257/780; 257/738

(58) Field of Classification Search ........ 257/737–738, 257/779–780; 438/613
See application file for complete search history.

(56) References Cited

U.S. PATENT DOCUMENTS 6,501,169 B1 * 12/2002 Aoki et al. ................. 257/700

7,061,127 B2 * 6/2006 Hashimoto ................. 257/797

FOREIGN PATENT DOCUMENTS

JP 2003-282790 10/2003

\* cited by examiner

*Primary Examiner*—Theresa T. Doan
(74) *Attorney, Agent, or Firm*—Harness, Dickey & Pierce, P.L.C.

(57) ABSTRACT

A surface, which is opposite to a plane polygon of a resin layer, includes a third side opposed to a first side of the plane polygon, and a fourth side oppose to a second side of the plane polygon. A first space between the first side and third side is narrower than a second space between the second side and fourth side. A plurality of electrodes are arranged in a first region located between the second side and the fourth side and are spaced apart from a second region located between the first side and the third side. The third side comprises a first curved line and a pair of second curved lines connected to both ends of the first curved line. The first curved line is convexly bent toward the inside of the resin layer and each of the second curved lines is convexly bent toward the outside of the resin layer.

5 Claims, 3 Drawing Sheets

SEMICONDUCTOR DEVICE HAVING CONDUCTIVE BUMPS, METHOD OF MANUFACTURING THEREOF, CIRCUIT BOARD AND ELECTRONIC APPARATUS

RELATED APPLICATIONS

This application claims priority to Japanese Patent Application No. 2004-133405 filed Apr. 28, 2004 which is hereby expressly incorporated by reference herein in its entirety.

BACKGROUND

1. Technical Field

The present invention relates a semiconductor device and a method of manufacturing thereof, a circuit substrate and an electronic apparatus.

2. Related Art

A structure having a resin layer formed in a semiconductor chip which absorbs outer force applied to the external terminals (a solder ball for example) is under development. Even in this structure, it is necessary to suppress the effect of an internal stress within a resin layer toward a semiconductor chip (particularly passivation film formed on the surface).

The object of the present invention is to suppress the effect of an internal stress within a resin layer formed in a semiconductor chip.

SUMMARY

A semiconductor device of the present invention comprises:
a semiconductor chip including a plane polygon and an integrated circuit;
a plurality of electrodes formed on the surface of the plane polygon;
a resin layer formed on the surface of the plane polygon of the semiconductor chip;
a wiring formed to reach the upper side of the resin layer from at least one of the plurality of electrodes; and
an external terminal formed on a part of the surface of the resin layer, wherein:
the plane polygon has a pair of first sides, which are parallel to each other, and a pair of second sides which are parallel to each other;
the surface of the resin layer which is opposite to the plane polygon has a third side, which is opposed to one of the first sides and a fourth side, which is oppose to one of the second sides;
the space between the one first side and the third side is narrower than the space between the one second side and the fourth side;
the plurality of electrodes are arranged in a region located between the one second side and the fourth side, and are not formed in a region located between the one first side and the third side;
the third side comprises a first curved line and a pair of second curved lines connected the both ends of the first curved line; and
the first curve is convexly bent toward the inside of the resin layer and each of the second curved lines is convexly bent toward the outside of the resin layer.

According to the invention, the third side of the resin layer (which is closer to a side of the plane polygon than the fourth side) is a curved line preventing local concentration of a stress and cracking of members constituting a plane polygon.

In the semiconductor device, the radius of curvature at all points on the first curved line is larger than the radius of curvature at all points on the second curved line.

In a circuit substrate of the present invention, the above mentioned semiconductor device is mounted.

In an electronic apparatus of the present invention, the above mentioned semiconductor device is installed.

A semiconductor device of the present invention comprises:
a semiconductor wafer including a plurality of integrated circuits;
a resin layer formed on the surface of a plane polygon above each of the integrated circuits of the semiconductor wafer;
a plurality of electrodes formed on the surface of the plane polygon of the semiconductor wafer;
a wiring formed to reach the upper side of the resin layer from at least one of the plurality of electrodes; and
an external terminal formed on a part of the surface of the resin layer, wherein:
the plane polygon has a pair of first sides, which are parallel to each other, and a pair of second sides which are parallel to each other;
the surface of the resin layer which is opposite to the plane polygon has a third side, which is opposed to one of the first sides and a fourth side, which is oppose to one of the second sides;
the space between the one first side and the third side is narrower than the space between the one second side and the fourth side;
the plurality of electrodes are arranged in a region located between the one second side and the fourth side and are not formed in a region located between the one first side and the third side;
the third side comprises a first curved line and a pair of second curved lines connected to both ends of the first curved line; and
the first curved line is convexly bent toward the inside of the resin layer and each of the second curved lines is convexly bent toward the outside of the resin layer.

According to the invention, the third side of the resin layer (which is closer to a side of the plane polygon than the fourth side) is a curved line preventing local concentration of a stress and cracking of members constituting the plane polygon.

A method of a semiconductor device of the invention comprises:
forming a resin layer in a plane polygon of a semiconductor wafer where a plurality of integrated circuits are formed and a plurality of electrodes are formed in the plane polygon above each of integrated circuits;
forming a wiring to reach the upper side of the resin layer from at least one of the plurality of electrodes; and
forming an external terminal on a part of the surface of the resin layer, wherein:
the plane polygon has a pair of first sides, which are parallel to each other, and a pair of second sides which are parallel to each other;
the surface of the resin layer, which is opposite to the plane polygon, has a third side opposed to one of the first sides, and a fourth side oppose to one of the second sides;
the space between the one first side and the third side is narrower than the space between the one second side and the fourth side;

the third side comprises a first curved line and a pair of second curved lines connected to both ends of the first curved line;

the first curve is convexly bent toward the inside of the resin layer and each of the second curved lines is convexly bent toward the outside of the resin layer; and the plurality of electrodes are arranged in a region located between the one second side and the fourth side and are not formed in a region located between the one first side and the third side.

According to the invention, the third side of the resin layer (which is closer to a side of the plane polygon than the fourth side) is a curved line preventing local concentration of a stress and cracking of members constituting the plane polygon.

DETAILED DESCRIPTION

The preferred embodiments of the invention are explained referring to figures.

Figure 1:
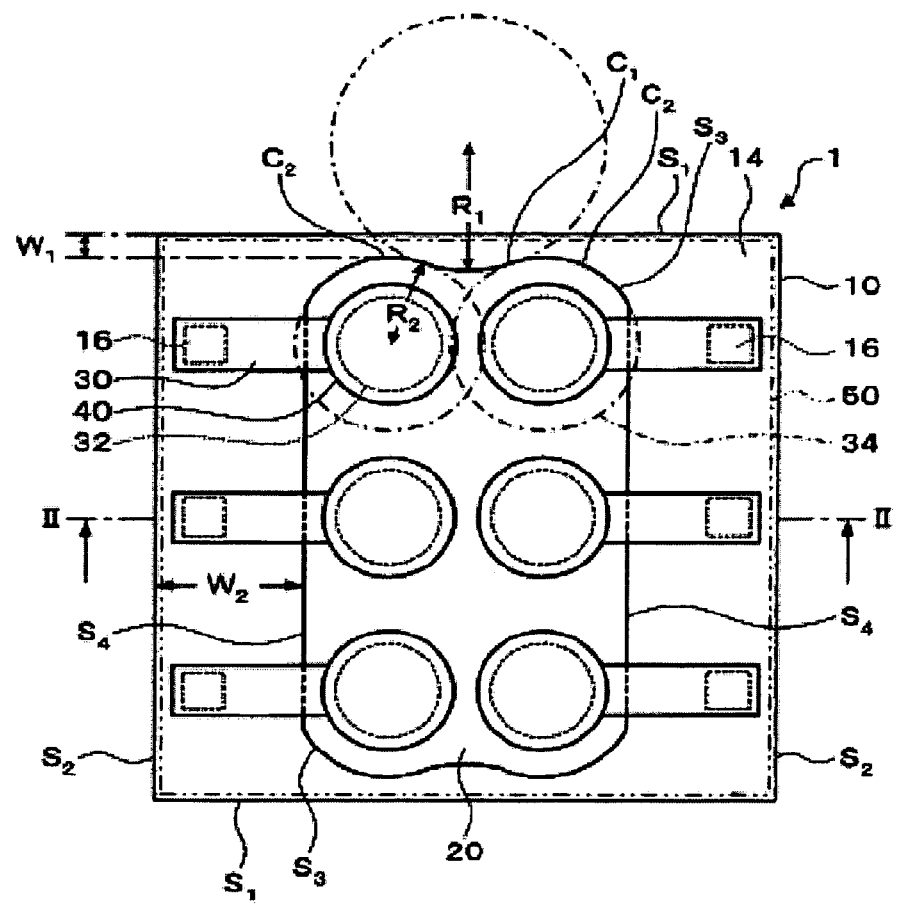
FIG. 1 illustrates a semiconductor device of the embodiment.
Figure 2:
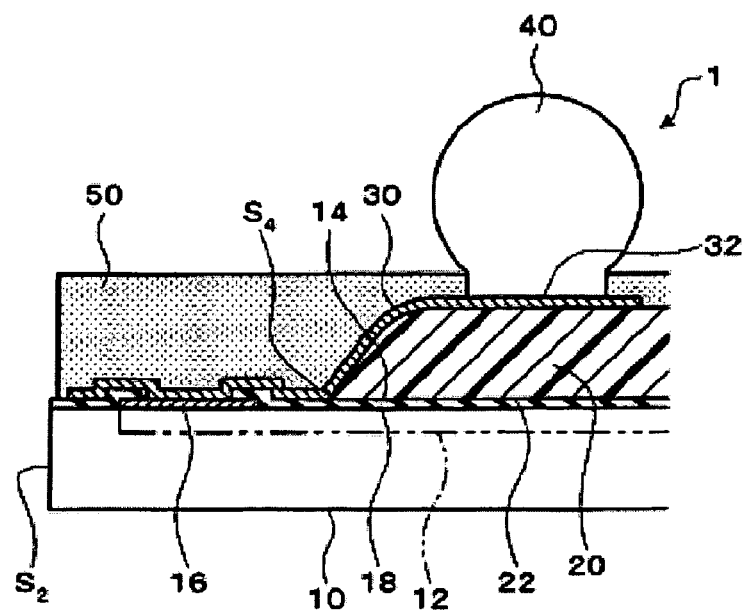
FIG. 2 is a partial view of a cross section taken along line II—II of the semiconductor device shown in FIG. 1.

FIG. 1 is a semiconductor device of the embodiment. FIG. 2 is a diagram showing a partial cross section taken along the II—II line of the semiconductor device shown in FIG. 1.

A semiconductor device 1 has a semiconductor chip 10. An integrated circuit 12 is formed in the semiconductor chip 10. The integrated circuit 12 includes active elements such as transistors. The semiconductor chip 10 includes a plane polygon (a tetragon for example) 14 shown in FIG. 1. The plane polygon 14 may be a configuration in which an angle of the plane polygon (a rectangular surface for example) is chipped. The plane polygon 14 has a pair of first sides $S_1$, which are parallel to each other, and a pair of second sides $S_2$ which are parallel to each other, (or has only these sides). The first sides $S_1$ may connect the pair of second sides $S_2$ to each other. The angle between the first sides $S_1$ and the second sides $S_2$ may be a right angle.

The plurality of electrodes 16 (pads for example) are installed in the plane polygon 14. The electrodes 16 are electrically connected to the inside of the semiconductor chip 10 (the integrated circuit 12 or a part of crystallization of the semiconductor avoiding the integrated circuit 12). The electrodes 16 are arranged at the ends of the plane polygon 14. The electrodes 16 are arranged along the second side $S_2$ at the ends of the plane polygon 14. The electrodes 16 are arranged to avoid the ends along the first side $S_1$ of the plane polygon 14.

The plane polygon 14 of the semiconductor chip 10 is a passivation layer 18 (a silicon nitride layer, or a silicon oxide layer or organic thin film, or a multi-layered film of these materials) shown in FIG. 2. The passivation layer 18 is formed to avoid at least a central portion of the electrodes 16 (exposing the central portion). The passivation layer 18 is an insulation layer. The passivation layer 18 may be formed to reach the circumference of a part of crystallization of the semiconductor of the semiconductor chip or not to reach such circumference.

The resin layer 20 including at least one layer is formed on the plane polygon 14 (on the passivation layer 18 for example). The resin layer 20 is attached to the plane polygon 14. The resin layer 20 may be arranged at the center of the plane polygon 14. The resin layer 20 is arranged to avoid the plane polygon 16. The resin layer 20 may also have a stress relaxation property. The resin layer 20 may be made of polyimide resin, silicon denaturation of polyimide resin, epoxy resin, silicon denaturation of epoxy resin, phenolic resin, acrylic resin, benzocyclo butene (BCB), poly benz oxazole (PBO), phenol group resin, or bridged rubber.

An opposite surface 22 (bottom surface) opposing the plane polygon 14 of the resin layer 20 includes a plane polygon (tetragon for example) having a pair of third sides $S_3$, each of which opposes one of the first sides $S_1$ and a pair of fourth sides $S_4$, each of which opposes one of the second sides $S_2$. In this specification, "opposing sides" means that a straight line perpendicular to one side crosses another side.

A space $W_1$ between the first side $S_1$ and third side $S_3$, which are opposite to each other, is narrower than a space $W_2$ between the second side $S_2$ and fourth side $S_4$, which are opposite to each other. The plurality of electrodes 16 are arranged in a region located between the second $S_2$ and the fourth side $S_4$ which are opposite to each other, avoiding regions located between the first $S_1$ and the third side $S_3$, which are opposite to each other.

The third side $S_3$ comprises a first curved line $C_1$ and a pair of second curved lines $C_2$ connected to both ends (sides) of the first curved line $C_1$. The first curved line $C_1$ is convexly bent toward the inside of the resin layer 20 and each of the second curved lines $C_2$ is convexly bent toward the outside of the resin layer 20. The radius of curvature $R_1$ at all points on the first curved line $C_1$ are larger than the radius of curvature $R_2$ at all points on the second curved line $C_2$.

The coefficient of thermal expansion of the resin layer 20 (the linear expansion coefficient, for example) is different from that of the members (the passivation layer 18 for example) constituting the plane polygon 14 (the former is larger than the latter, for example). Internal stress is generated in the resin layer 20 attached to the plane polygon 24 if it is expanded or shrunk. The internal stress of the resin layer 20 gives force to the members constituting the plane polygon 14. Particularly, in the circumference of the resin layer 20, there is a big difference between one stress applied to the plane polygon 14 directly under the resin layer 20 inside of the circumference and another stress applied to the plane polygon 14 where the resin layer 20 does not exist outside of the circumference. Therefore, when the position in which a force is given, is near to the circumference of members constituting the plane polygon 14, members constituting the plane polygon 14 are easily cracked.

According to the embodiment, the third side $S_3$ of the resin layer 20 (closer to a periphery of plane polygon 14 than the fourth side $S_4$) is a curved line preventing local concentration of a stress (namely deconcentrating a force applied to the plane polygon 14) and cracking of members (the passivation film 18 for example) constituting a plane polygon 14.

Here, the side of the resin layer 20 may be tilted as shown in FIG. 2. In such case, the surface of the resin layer 20 is smaller than the opposite surface 22 opposing the plane polygon 14. As a modification, the side of the resin layer 20 may stand perpendicularly to the opposite surface 22 opposing the plane polygon 14. The resin layer 20 may be curved without any angles from the side to the upper surface.

The resin layer 20 may be formed to be a flat surface in a part of region forming the wiring 30. For example, the resin layer 20 may have a flat surface at least under the wiring 30 from side standing from the fourth side $S_4$ to the upper surface. Here, the fourth side $S_4$ may be a straight line as shown in FIG. 1.

The semiconductor device 1 has the wiring 30. The wiring 30 is formed to reach the resin layer 20 from the electrodes 16. In detail, the wiring 30 includes a portion overlapping the electrodes 16 and electrically connected to the electrodes 16. The wiring 30 includes a portion overlapping the resin layer 20 (its side and upper surface). The wiring 30 may include a land (a portion wider than other portions). The wiring 30 may be formed on the passivation film 18 in a region between the electrode 16 and the resin layer 20.

The wiring 30 is made of a conductive material (a metal for example). The wiring 30 is formed as a single layer or multiple layers. In case of multiple layers, for the purpose of structural reliability and electrical characteristics, the following materials, for example, may be combined as the wiring 30: Copper, Chromium, Titan, Nickel, Titan tungsten, Au, Aluminum, Nickel vanadium and Tungsten.

A semiconductor device 1 has the wiring 40. The external terminal 40 is formed on the wiring 30 (a part such as a land on the resin layer of the wiring 30 in detail.) The external terminal 40 is electrically connected to the wiring 30. The external terminal 40 is electrically connected to the electrodes 16 via the wiring 30. The external terminal 40 may be made of a metal having conductivity. The external terminal 40 may be made of a brazing filler metal. The external terminal 40 may have the configuration in which a part of a sphere is broken away or a brazing filler metal shape, for example.

The second resin layer 50 is formed on the resin layer 20. The second resin layer 50 may have a light blocking effect or translucency. The second resin layer 50 is formed covering a part of the wiring 30 (a part of a land except central portion). The second resin layer 50 is formed to avoid a part of the wiring 30 on a part of the resin layer 20 (at least a central portion of a land, for example) and exposing it.

The external terminal 40 is formed on a portion 32 of the wiring 30 exposed from the second resin 50. Namely, the portion 32 exposed from the second resin 50 is a portion for connecting to the external terminal 40. The second resin 50 is used for a solder-resist. The exposed portion 32 may be circular and a part (an arc) of a circle 34 which is concentric with the outer circle of the portion 32 may be the above second curve $C_2$. In this case, when the outer force is transferred from the external terminal 40 to the exposed portion 32, an end portion including the second curve $C_2$ of the resin layer 20 is dispersed uniformly preventing localized stress concentration.

Figure 3:
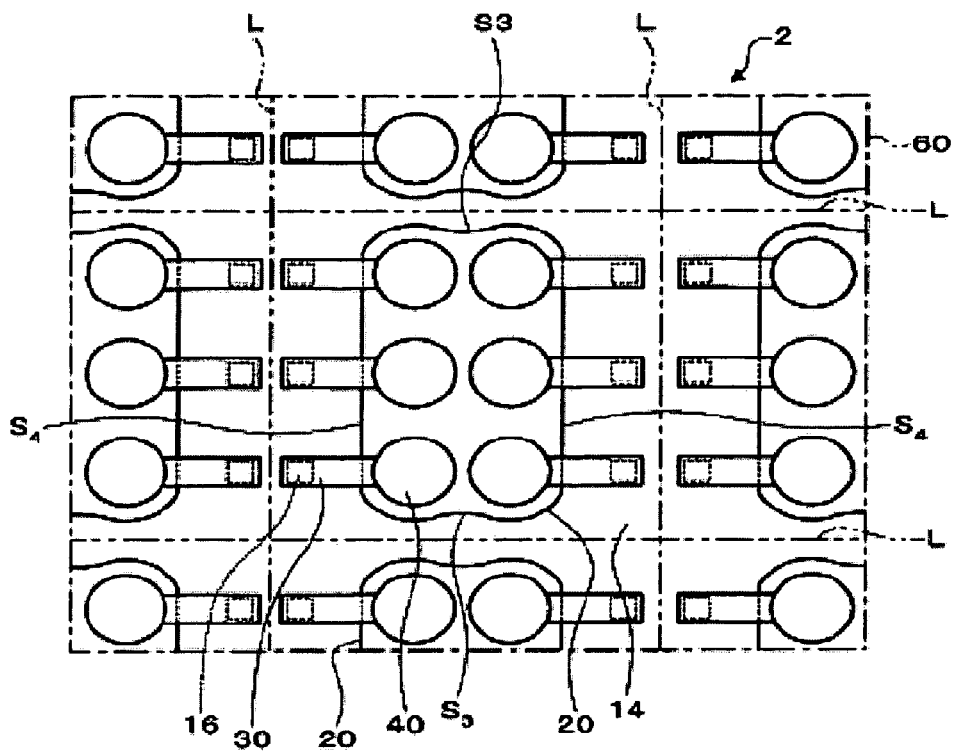
FIG. 3 shows a manufacturing process of a semiconductor device of the embodiment of the invention.

FIG. 3 shows a manufacturing process of a semiconductor device of the embodiment of the invention. A semiconductor device 1 shown in FIG. 1 is obtained by cutting a semiconductor device 2 (dicing for example) shown in FIG. 3. FIG. 3 shows a part of the semiconductor device 2. The semiconductor device 2 has a semiconductor wafer 60. The semiconductor wafer 60 is cut (by dicing for example) obtaining a plurality of semiconductor chips 10 (shown in FIG. 1). In other words, the semiconductor wafer 60 is a collection of a plurality of semiconductor chips 10. The semiconductor device 2 is a collection of a plurality of semiconductor devices 1.

A plurality of integrated circuits 12 is formed in the semiconductor wafer 60. The resin layer 20 is provided in pluralities that are spaced apart each other in the semiconductor wafer 60. The resin layer 20 is formed on the plane polygon 14 located above each of integrated circuits 12 of the semiconductor wafer 60. Here, the plane polygon 14 is a region to be the semiconductor chip 10, which is surrounded with a plurality of the dicing lines L of the semiconductor wafer 60 for example. The above mentioned content of the semiconductor device 1 is applied to other details.

In the manufacturing process for the semiconductor device 2, the resin layer 20 is formed on the plane polygon 14 of the semiconductor wafer 60. A resin precursor is coated on the semiconductor wafer 60 forming a layer by spin coating or the like and patterned by lithography as forming the resin layer 20. Details of the resin layer 20 have already been explained.

The wiring 30 is formed to reach the resin layer 20 from any of the electrodes 16. The method of forming it may include forming a film by sputtering or evaporation and etching it. In order to make the thickness of the wiring 30 thicker, after forming the first conductive electrode by sputtering or the like, a desired pattern may be formed by depositing a resist and patterning it. Then, the second conductive layer may be formed in the area exposed from the resist layer of the first conductive layer and after removing a resist, the first conductive layer 1 is etched as the second conductive layer being masked so as to from the thicker wiring 30. The wiring 30 may be directly formed by an inkjet method or the like.

The second resin layer 50 is formed on each of the resin layer 20 covering the wiring except some portions. A resin precursor is coated by spin coating or the like as a layer and patterned by lithography forming the second resin layer 50. It is easy to form the wiring 30 if the region for forming the wiring 30 on the resin layer 20 is planar.

Then, the external terminal 40 is formed on the wiring 30 located on the resin layer 20. The semiconductor wafer 60 is cut along each area of a plurality of integrated circuits 12. The semiconductor wafer 60 is cut to obtain the semiconductor device 1. According to this process, it is packaged for every wafer. The other contents and effects can be understood from the above-mentioned content of the semiconductor device and are therefore omitted here.

Figure 4:
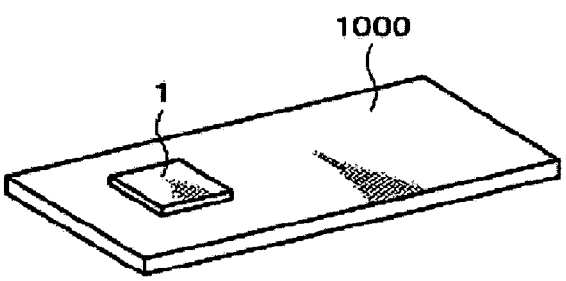
FIG. 4 shows a circuit substrate of the embodiment of the invention.
Figure 5:
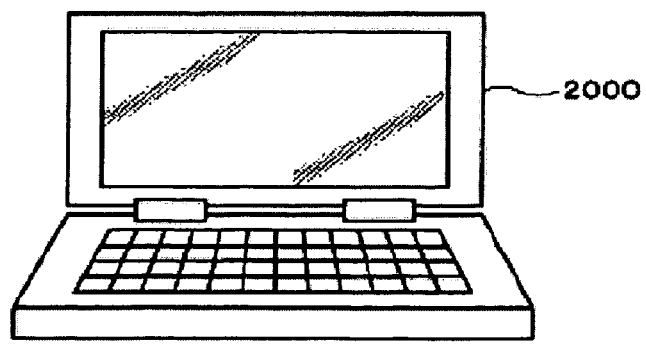
FIG. 5 shows electronic equipment according to the embodiment of the invention.
Figure 6:
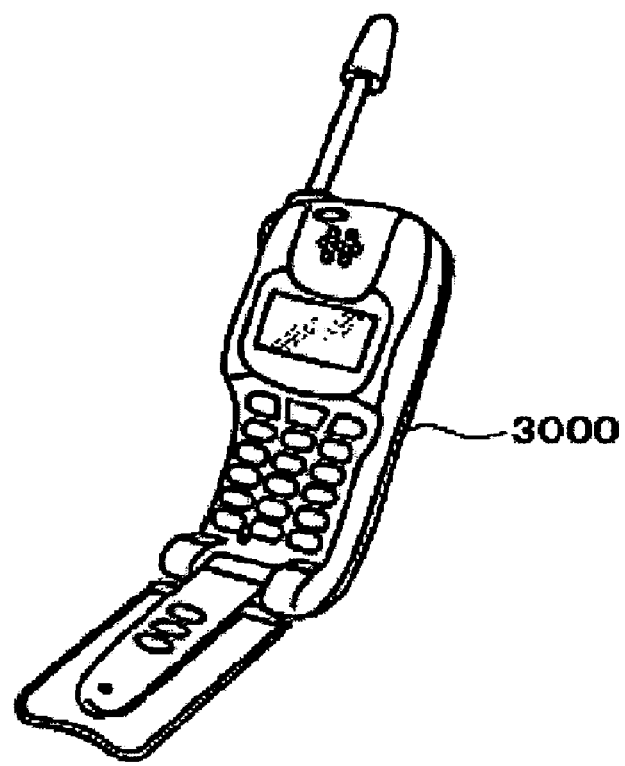
FIG. 6 shows electronic equipment according to the embodiment of the invention.

FIG. 4 shows a circuit board 1000 in which the semiconductor device 1 of the embodiment of the invention is mounted. As electronic equipment having the semiconductor device of the embodiment of the invention, FIG. 5 shows a note type personal computer 2000 and FIG. 6 shows a cellar phone 3000.

It should be noted that the present invention is not limited to the above-mentioned embodiments, and various changes and modifications can be made within the spirit and scope of the invention. For example, the present invention includes substantially the same structure (including the structure with the same functions, methods, and results and the structure with the same goals and results) as the structure of the above-mentioned embodiments. The present invention also includes other structures in which non-essential elements of the above-mentioned embodiments are substituted. The present invention also includes structures that can achieve the same effects or the same goals as those achieved by the above-mentioned embodiments. Moreover, the present invention includes other structures in which known methods and techniques are incorporated into the above-mentioned embodiments. Moreover, the present invention includes structures which are limitedly excluded from any of technical items explained in the above embodiments. Moreover, the present invention includes structures in which any well known technology is limitedly excluded from the above mentioned embodiments.

What is claimed is:

1. A semiconductor device comprising:
a semiconductor chip including a plane polygon and an integrated circuit;
a plurality of electrodes formed on the surface of the plane polygon of the semiconductor chip;
a resin layer formed on the surface of the plane polygon of the semiconductor chip;
a wiring formed to reach an upper side of the resin layer from at least one of the plurality of electrodes; and
an external terminal formed on a part of the surface of the resin layer, wherein:
the plane polygon has a pair of first sides, which are parallel to each other, and a pair of second sides which are parallel to each other;
the surface of the resin layer, which is opposite to the plane polygon, has a third side opposed to one of the first sides, and a fourth side oppose to one of the second sides;
a first space between the one first side and the third side is narrower than a second space between the one second side and the fourth side;
the plurality of electrodes are arranged in a first region located between the one second side and the fourth side and are spaced apart from a second region located between the one first side and the third side;
the third side includes a first curved line and a pair of second curved lines connected to both ends of the first curved line; and
the first curved line is convexly bent toward an inside of the resin layer and each of the second curved lines is convexly bent toward an outside of the resin layer.

2. A semiconductor device according to claim 1, wherein a radius of curvature at all points along the first curved line are larger than a radius of curvature at all points on the second curved line.

3. A circuit substrate including the semiconductor device according to claim 1 mounted thereon.

4. An electronic apparatus including the semiconductor device according to claim 1 installed therein.

5. A semiconductor device comprising:
a wafer including a plurality of integrated circuits;
a resin layer formed on a surface of a plane polygon above each of the integrated circuits of the semiconductor wafer;
a plurality of electrodes formed on the surface of the plane polygon of the semiconductor wafer;
a wiring formed to reach an upper side of the resin layer from at least one of the plurality of electrodes; and
an external terminal formed on a part of the surface of the resin layer, wherein:
the plane polygon has a pair of parallel first sides, and a pair of parallel second sides;
the surface of the resin layer which is opposite to the plane polygon has a third side opposed to one of the first sides, and a fourth side opposed to one of the second sides;
a first space between the one first side and the third side is narrower than a second space between the one second side and the fourth side;
the plurality of electrodes are arranged in a first region located between the one second side and the fourth side and are spaced apart from a second region located between the one first side and the third side;
the third side comprises a first curved line and a pair of second curved lines connected to both ends of the first curved line; and
the first curved line is convexly bent toward an inside of the resin layer and each of the second curved lines is convexly bent toward an outside of the resin layer.

* * * * *